US012607666B2

(12) United States Patent　　　　(10) Patent No.:　US 12,607,666 B2

Flores et al.　　　　　　　　　　　　　(45) Date of Patent:　　Apr. 21, 2026

(54) ELECTRICAL AND LOGIC ISOLATION FOR SYSTEMS ON A CHIP

(71) Applicant: Texas Instruments Incorporated, Dallas, TX (US)

(72) Inventors: Jose Luis Flores, Richardson, TX (US); Ramakrishnan Venkatasubramanian, Plano, TX (US); Samuel Paul Visalli, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 108 days.

(21) Appl. No.: 18/479,177

(22) Filed: Oct. 2, 2023

(65) Prior Publication Data

US 2024/0027515 A1　　Jan. 25, 2024

Related U.S. Application Data

(63) Continuation of application No. 17/127,109, filed on Dec. 18, 2020, now Pat. No. 11,774,487.

(60) Provisional application No. 62/956,391, filed on Jan. 2, 2020.

(51) Int. Cl.
| | |
|---|---|
| *G01R 31/28* | (2006.01) |
| *G01R 31/40* | (2020.01) |
| *G06F 1/3203* | (2019.01) |

(52) U.S. Cl.
CPC ......... *G01R 31/2803* (2013.01); *G01R 31/40* (2013.01); *G06F 1/3203* (2013.01)

(58) Field of Classification Search
CPC .... G01R 31/2803; G01R 31/40; G06F 1/3203
See application file for complete search history.

(56) References Cited

U.S. PATENT DOCUMENTS

| | | | |
|---|---|---|---|
| 5,946,175 A | 8/1999 | Yu | |
| 8,570,788 B2 | 10/2013 | Hess et al. | |
| 8,749,932 B2 | 6/2014 | Tanaka et al. | |
| 9,188,645 B2 | 11/2015 | Barrenscheen et al. | |
| 10,249,606 B2 * | 4/2019 | Suzuki ................ | H10D 89/813 |
| 10,498,396 B1 * | 12/2019 | Frey ........................ | H04B 5/75 |
| 11,183,452 B1 * | 11/2021 | Mueller-Meskamp ...................... H01L 21/76283 | |
| 2006/0125470 A1 | 6/2006 | Chen et al. | |
| 2012/0275236 A1 | 11/2012 | Hess | |
| 2012/0300349 A1 | 11/2012 | Abou-Khalil et al. | |

(Continued)

FOREIGN PATENT DOCUMENTS

| | | |
|---|---|---|
| CN | 1924822 A | 3/2007 |
| CN | 107223222 B | 1/2019 |
| CN | 110546590 B | 7/2023 |

OTHER PUBLICATIONS

International Search Report for PCT/US2021/012070 mailed Mar. 25, 2021.

(Continued)

*Primary Examiner* — Scott Bauer

(74) *Attorney, Agent, or Firm* — Kenneth Liu; Frank D. Cimino

(57) ABSTRACT

In described examples, an SoC includes at least two voltage domains interconnected with a communication bus. Detection logic in a first voltage domain determines when a voltage error occurs in a second voltage domain and isolates communication via the communication bus when a voltage error or a timing error is detected.

20 Claims, 4 Drawing Sheets

(56)                References Cited

U.S. PATENT DOCUMENTS

| | | |
|---|---|---|
| 2013/0321961 A1 | 12/2013 | Lin et al. |
| 2016/0283438 A1 | 9/2016 | Chen et al. |
| 2021/0026438 A1* | 1/2021 | Sharif ................ H03K 19/0016 |
| 2021/0083907 A1* | 3/2021 | Briano ................... H04B 17/17 |

OTHER PUBLICATIONS

"DRA829V Jacinto Automotive Processors Silicon Revision 1.0", DRA829V, Texas Instruments, Inc., Dec. 2019, pp. 1-309.
"Power Isolation", Semiconductor Engineering, available at https://semiengineering.com/knowledge_centerslow-power/techniques/power-isolation/ on Oct. 5, 2020, pp. 1-2.
National Intellectual Property Administration, Office Action for CN Application No. 2021800174054, mailed Sep. 19, 2025, 10 pages.

* cited by examiner

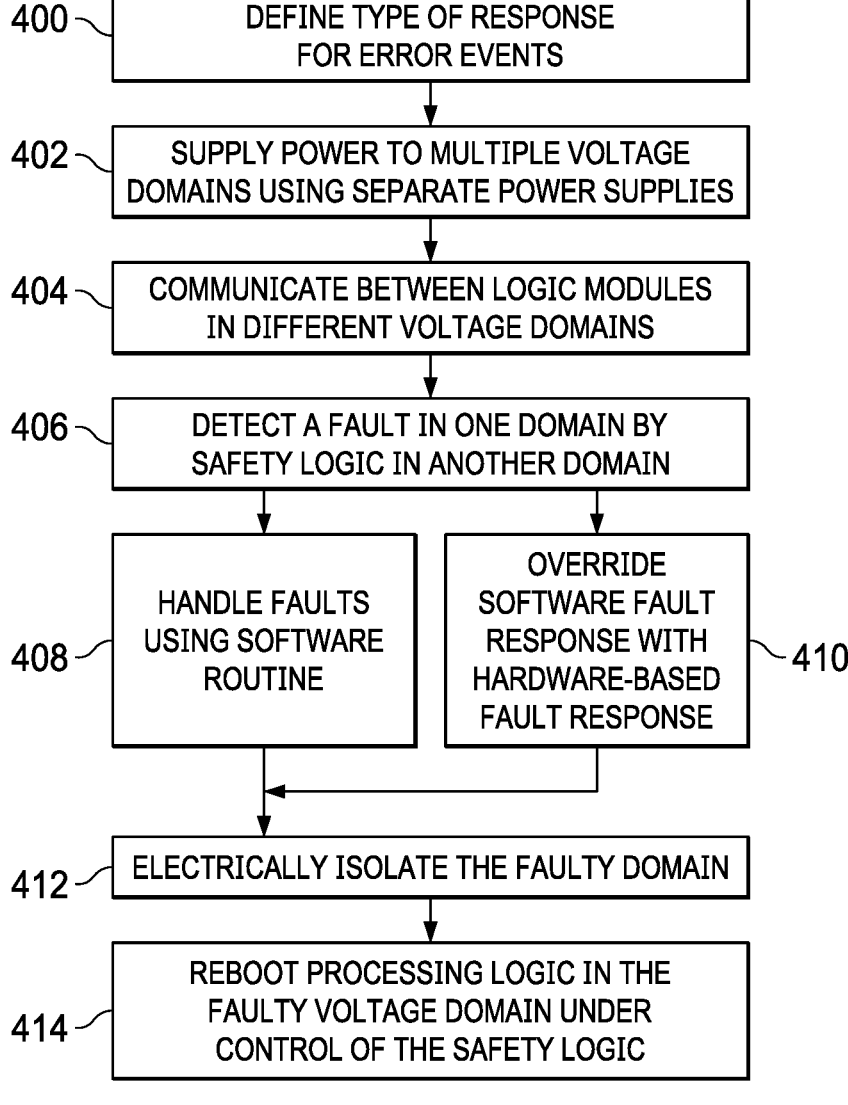

400 — DEFINE TYPE OF RESPONSE
FOR ERROR EVENTS

402 — SUPPLY POWER TO MULTIPLE VOLTAGE
DOMAINS USING SEPARATE POWER SUPPLIES

404 — COMMUNICATE BETWEEN LOGIC MODULES
IN DIFFERENT VOLTAGE DOMAINS

406 — DETECT A FAULT IN ONE DOMAIN BY
SAFETY LOGIC IN ANOTHER DOMAIN

408 — HANDLE FAULTS
USING SOFTWARE
ROUTINE

410 — OVERRIDE
SOFTWARE FAULT
RESPONSE WITH
HARDWARE-BASED
FAULT RESPONSE

412 — ELECTRICALLY ISOLATE THE FAULTY DOMAIN

414 — REBOOT PROCESSING LOGIC IN THE
FAULTY VOLTAGE DOMAIN UNDER
CONTROL OF THE SAFETY LOGIC

FIG. 4

ELECTRICAL AND LOGIC ISOLATION FOR SYSTEMS ON A CHIP

CROSS-REFERENCE TO RELATED APPLICATION

This application is a continuation of U.S. patent application Ser. No. 17/127,109, filed Dec. 18, 2020, which claims priority to U.S. Provisional Patent Application No. 62/956, 391 filed Jan. 2, 2020, each of which is incorporated herein by reference in its entirety.

TECHNICAL FIELD

This relates to logic and electrical isolation protection for safety of systems on a chip with high performance interfaces in the event of power supply failure.

BACKGROUND

In many modern integrated circuits (ICs) configured as a system on a chip (SoC), the circuitry of different functional units may be implemented within different power domains. There are several reasons for implementing different power domains. For example, some functional units may have different operating voltage requirement than others; in this case, circuits with different operating voltage requirements with respect to other circuits may be implemented in separate power domains.

Another reason for implementing different circuits in different power domains may be due to power saving requirements. While the circuitry of two different functional units may operate at the same supply voltage, the arrangement of an IC on which they are both implemented may require that one be capable of being powered down while the power is still applied to the other.

Although an IC may implement various functional units in different power domains, many of these functional units may be interfaced with functional units in other power domains. When functional units of two different power domains are both receiving power, communications between them may occur. Communications between the two functional units may be inhibited when one of the power domains is powered down.

SUMMARY

In described examples, an SoC includes at least two voltage domains interconnected with a communication bus. Detection logic in a first voltage domain determines when a voltage error occurs in a second voltage domain and isolates communication via the communication bus when a voltage fault or a timing error is detected.

BRIEF DESCRIPTION OF THE DRAWINGS

FIG. 4 is a flow diagram of operation of an example SoC device that has multiple voltage domains.

DETAILED DESCRIPTION

Figure 1:
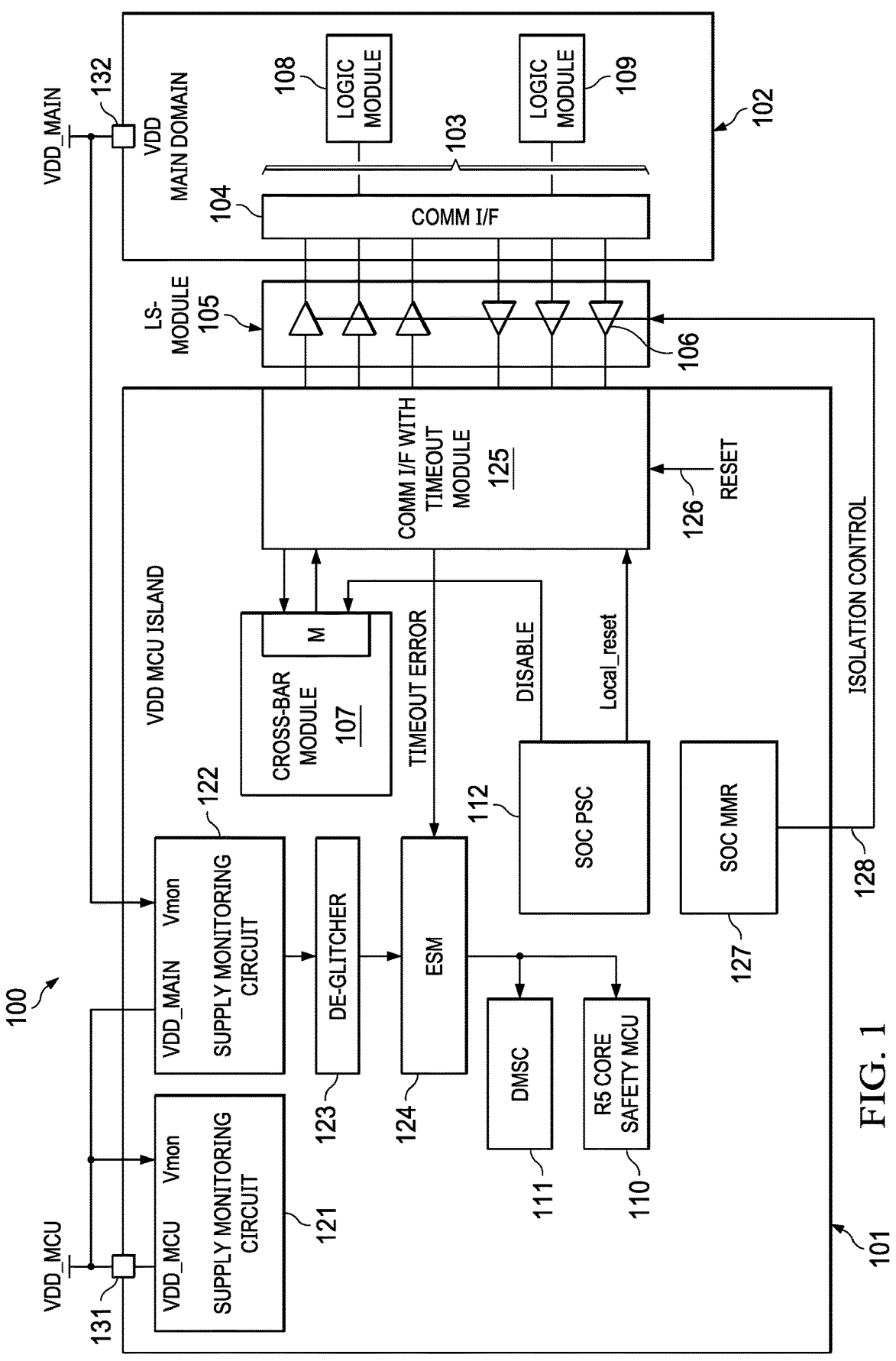
FIGS. 1 and 2 are block diagrams of example SoCs that include multiple voltage domains with safety isolation logic between the domains.

In the drawings, like elements are denoted by like reference numerals for consistency.

In an integrated circuit targeted for a safety application, multiple voltage domains are implemented to provide isolation between functional units in case of a failure in a domain. One or more voltage domains are identified as a high priority domain and steps are taken to isolate the high priority domain so that functional devices within the high priority domain can continue to operate when another voltage domain in the same integrated circuit fails. That requirement is very challenging to meet in an integrated circuit that has multiple high-performance interfaces communicating between the high priority domain and the faulty regions of the integrated circuit.

Examples described herein provide logic and electrical isolation for an integrated circuit that has one or multiple high-performance interfaces communicating between a high priority voltage domain and another voltage domain of the integrated circuit, by means of a combination of hardware and software responses to failure of a power supply or a timing error.

Examples described herein provide components of both hardware and software that operate in response to a voltage supply failure to achieve a robust logic and electrical isolation between voltage domains, where the interfaces between the voltage domains are not fault tolerant.

An example automotive SoC is described in more detail in "DRA829V Jacinto™ Automotive Processors Silicon Revision 1.0," Texas Instruments, SPRSP50, December 2019, which is incorporated by reference herein. Jacinto™ 7 DRA829V automotive processors, based on the Arm® v8 64-bit architecture, provide advanced system integration to enable lower system costs of automotive applications such as Gateway, Vehicle Compute, and Body Domain Controller. Integrated diagnostics and functional safety features are targeted to ASIL-B/C certification/requirements. An integrated microcontroller (MCU) island eliminates the need for an external system MCU. The device features a Gigabit Ethernet switch and a PCIe hub which enables networking use cases that require heavy data bandwidth. Up to four Arm® Cortex®-R5F subsystems manage low level, timing critical processing tasks leaving the Arm® Cortex®-A72's unencumbered for applications. A dual-core cluster configuration of Arm® Cortex®-A72 facilitates multi-OS applications with minimal need for a software hypervisor.

FIG. 1 is a block diagram of an example SOC 100 that includes multiple voltage domains 101, 102 with safety isolation logic 105 between the domains. SOC 100 is a simplified example illustrating the use of safety isolation logic between voltage domains that can be applied to more complex SOCs with multiple voltage domains, such as the Jacinto family of automotive processors. Voltage domain 102 is voltage isolated from voltage domain 101 so that a failure of the voltage supply for voltage domain 102 does not compromise operation of fault detection logic on voltage domain 101. In some examples, voltage domain 101 may still receive a voltage from the voltage supply of voltage domain 102 for power failure and/or fault detection yet remain voltage isolated.

Communication bus 103 is coupled between communication interface 104 in main domain 102 and communication interface 125 in safety domain 101. Safety isolation logic 105 includes a set of pass-gates as indicated at 106 that are arranged so that each signal line of communication bus 103 can be isolated in response to a control signal provided by memory mapped register (MMR) 127. In this example, only three signal lines are illustrated to provide communication in each direction between MCU island domain 101 and main domain 102. However, the communication bus 103 may include tens or hundreds of individual signal lines that provide information between voltage domain 101 and voltage domain 102.

There may be several different portions of communication bus 103 coupled between various logic and processing modules in main voltage domain 102 and MCU island voltage domain 101. In this example, logic module 107 in voltage domain 101 is a crossbar module coupled to the different portions of communication bus 103 to allow dynamic routing of information through various portions of communication bus 103. Logic module 108 in voltage domain 102 is a processing unit that processes data received on communication bus 103 from other portions of main domain 102, such as logic unit 109. Each signal line of communication bus 103 is outfitted with a pass gates such as indicated at 106 to allow processing logic in MCU island voltage domain 101 to be completely isolated from processing logic in main domain 102 in the case of a failure in main domain 102. In a first mode of operation, communication bus 103 is fully transparent and provides data communication in a normal manner. In a second mode of operation, communication bus 103 is placed in an isolation mode that prevents erroneous data from being transferred over communication bus 103. In this manner, processing logic located in MCU island voltage domain 101 can continue operation in order to assist in restoring operation of SOC 100 or even rebooting main domain 102 after a fault condition is corrected.

MCU island voltage domain 101 includes safety MCU 110, device management and security controller (DMSC) 111, and power and sleep controller (PSC) 112. PSC 112 is responsible for managing transitions of system power on/off, clock on/off, and reset. A clock gating feature of the PSC may be used for power savings. Many of the operations of the PSC are transparent to software being executed in processors in the main domain 102, such as power-on and hard reset operations. The PSC provides an interface to control several important power, clock, and reset operations.

In this example, device management and security control (DMSC) 111 attempts to resolve issues that may occur during operation of a complex SoC by being a consistent component across a family of SoC devices by performing the role of a centralized SoC power, security, and device management controller. DMSC 111 supports complex interactions between operating systems on heterogeneous SoCs for generic features and provides consistency in SoC feature entitlement in all OSes for the SoC for complex SoC features. DMSC 111 provides a centralized knowledge of system state. In effect, this is a microcontroller and runs a safety and security certified software that provides services to the rest of the OSes/Software running on various other processors on the SoC 100.

DMSC 111 controls the power management of SoC 100 and is responsible for bringing the device out of reset and enforcing clock and reset rules. DMSC power management functions are critical to bring SoC 100 to low power modes, such as "deep-sleep" mode, and senses wake-up events to bring SoC 100 back online to an active state.

The DMSC security management software manages SoC 100 central security resources. The security subsystem provides application programing interfaces (API) to other software entities to avail these features in a controlled and secure way. The security management software is subdivided into modules such as: firewall management; ISC management; boot authentication; SA2UL context management (for encryption and authentication); crypto APIs (to access common SA2UL functions such as PKA, RNG); secure keys management; secure debug; etc.

The DMSC software Resource Management (RM) (sub) system manages SoC shared resources. RM manages access and configuration of shared resources amongst SoC 100 processing entities. RM provides a set of interfaces over which SoC processing entities can allocate and free access to shared resources, such as: core database; IRQ management; ring accelerator management; UDMA-P management; PSI-L management; non-secure proxy management; communication with DMSC, etc.

DMSC 111 is a "black box" with respect to the other processing entities (ARM/DSP) on the SoC. Communication with DMSC 111 occurs using a predefined request-response protocol that provides access to the various services provided by DMSC 111. The actual messaging hardware block varies depending on SoC, but typical examples include "Proxy over message manager" and "Secure Proxy over Ring Accelerator". These communication mechanisms are standardized and secured by DMSC software prior to operation.

Main domain 102 includes at least one processor and associated memory, peripherals, and interface circuits to execute software program instructions in order to provide an intended function of SoC 100, such as automotive or industrial applications.

MCU island voltage domain 101 also includes VDD_MCU supply monitoring circuit 121 and VDD_MAIN supply monitoring circuit 122 that are connected to respective voltage supplies VDD_MCU and VDD_MAIN via voltage terminals 131, 132, respectively. VDD_MCU is the operating voltage provided to MCU island voltage domain 101 and is used by the various processing logic 110, 111, etc. located within MCU island voltage domain 101. VDD_MAIN is the operating voltage provided to main voltage domain 102 and is used by the various processing logic, memories, etc. located within main voltage domain 102. VDD_MCU and VDD_MAIN are provided by separate power supplies that may be derived from a system power source such as provided by an automobile or manufacturing system.

VDD_MCU supply monitoring circuit 121 monitors VDD_MCU for low voltage or high voltage conditions. The VCC_MCU supply is a robust supply that may include backup capabilities (such as battery backup) in order to maintain operation of the MCU safety island voltage domain under adverse conditions. VDD_MAIN supply monitoring circuit 122 monitors VDD_MAIN for low voltage or high voltage conditions. Detected voltage anomalies in VDD_MAIN generate events that are sent to de-glitcher circuit 123 to filter out short transient voltage anomalies, and then on to error signaling module (ESM) 124.

Communication interface 125 includes timeout logic that monitors transactions that are occurring on communication bus 103. If a given transaction take too long and times out, then a timeout error signal is activated to ESM 124. In this example, communications bus 103 is an asynchronous interface between the safety island domain 101 and main domain 102. Asynchronous communication bus 103 interfaces natively support unlocking of the bus to achieve the required logical and electrical isolation. Reset signal 126 is responsive to safety MCU 110 and is typically activated to flush out the communication interface 125 when main domain 102 is reset.

ESM 124 aggregates safety-related events and/or errors from throughout SoC 100 into one location. It can signal both low and high priority interrupts to safety MCU 110 and to DMSC 111 to deal with a safety event and/or manipulate an I/O error pin to signal external hardware that an error has occurred. ESM 124 receives voltage error signals from VDD_MCU supply monitoring circuit 121 and VDD_MAIN supply monitoring circuit 122, and timeout error signals from timeout logic in interface 125 and sends alerts to DMSC 111 and core safety MCU 110.

Safety software running in the core safety MCU 110 allows a programmable response in the event of a failure being detected. Software code and actions are provided to ensure robustness of a response to a detected failure. For example, a failure in a voltage level reported by the voltage monitor will trigger an interrupt, which in turn will cause the safety core in the MCU to execute a service routine that will go and check the various voltage monitors to identify the voltage domain(s) experiencing the failure(s). From there that same software can check further status of the timeout circuits and activate then to start operating in auto-acknowledge mode in response to any MCU master request and ignoring/blocking the potentially corrupted arriving data from the MAIN domain, which is the one assumed failing in this case.

In various examples, the software code running in the MCU core could be either vendor provided safety software code, which is developed by the makers of the SOC, or user provided safety software code, which is implemented by a reseller or user of the SOC. Vendor provided safety software code is transparent to the customer.

The safety software includes program instructions that are executed by safety MCU 110 and DMSC 111. In some examples, the safety software is stored in read only memory that is accessible to respective processors 110, 111. In some examples, there may be a portion of safety software that can be installed or updated during operation of SOC 100.

MMR 127 responds to safety MCU 110 in the event of a detected voltage failure or timeout error to activate isolation control line 128 to cause safety isolation logic 105 to isolate MCU island 101 from main domain 102 by interrupting communication bus 103. When activated, isolation control line 128 causes all of the pass gates 106 to open to prevent erroneous or erratic signals generated by failing logic with main domain 102 from being transmitted to MCU island 101 via communication bus 103. In this manner, safety MCU 110 and DMSC 111 can continue to operate correctly and attempt to restore processing in main domain 102.

Once an error condition has been corrected, safety MCU 110 causes MMR 127 to deactivate isolation control signal 128 and thereby allow communication bus 103 to resume normal communication between MCU domain 101 and main domain 102.

In this example, fault detection logic within voltage domain 101 includes the supply monitoring circuits 121, 122, ESM module 124, safety MCU 110, DMSC 111, and MMR 127 that act in an autonomous manner by means of a combination of hardware and software responses to failure of a power supply or a timing error. In this manner, operation of SoC 100 can often be restored quickly after a fault condition is resolved. In other examples, fault detection logic within voltage domain 101 may include additional, or different, types of hardware and software capabilities that are used to resolve a failure of a power supply or a timing error.

Figure 2:
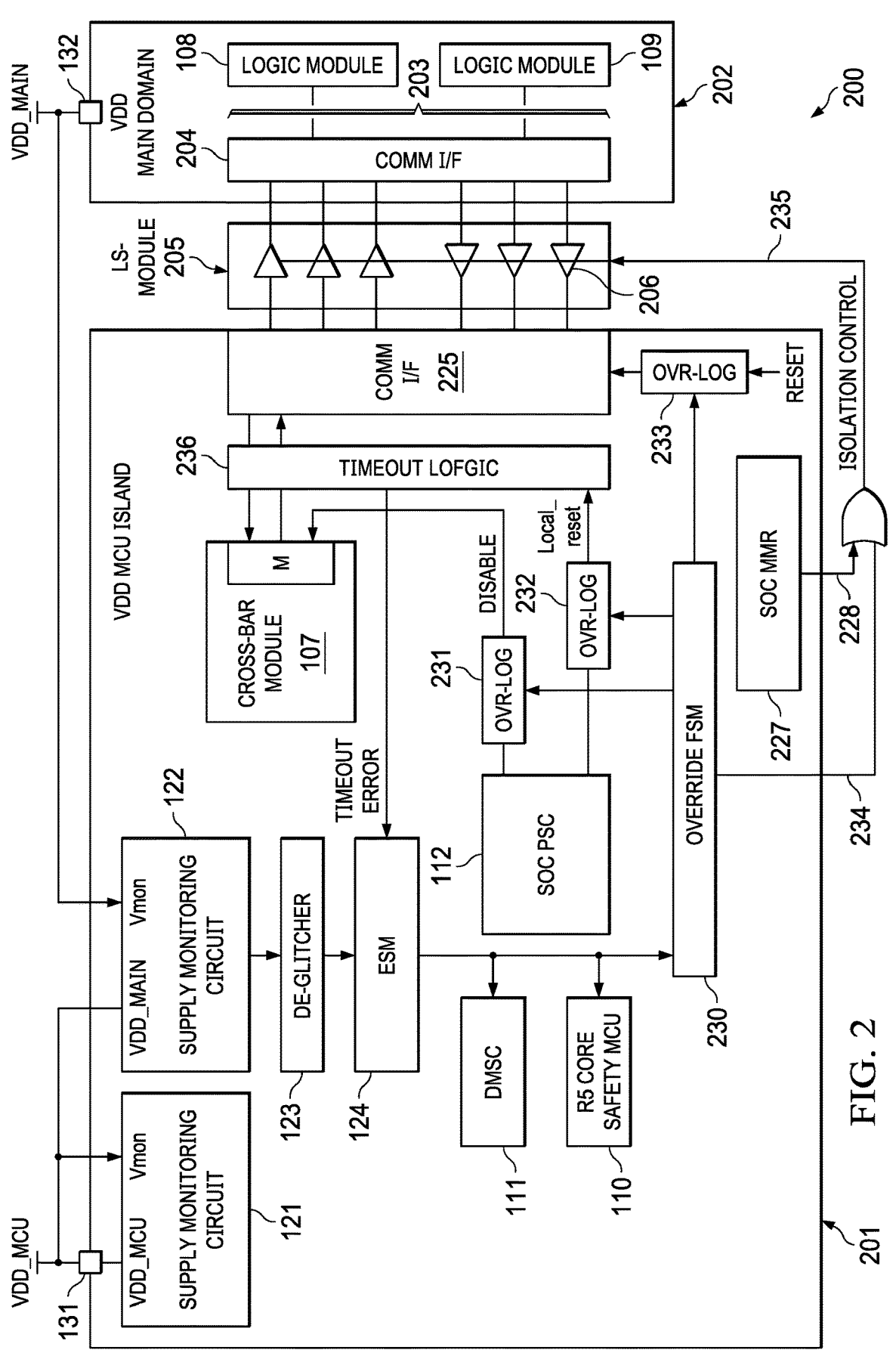

FIG. 2 is a block diagram of an example SOC 200 that includes multiple voltage domains 201, 202 with safety isolation logic 205 between the domains. SOC 200 is a simplified example illustrating the use of safety isolation logic between voltage domains that can be applied to more complex SOCs with multiple voltage domains, such as the Jacinto family of automotive processors.

SoC 200 is similar to SoC 100 (FIG. 1) and includes safety MCU 110, DMSC 111, PSC 112, ESM 124, etc. as described in more detail for FIG. 1. In this example, communication bus 203 is a high performance fully synchronous interfaces that does not support bus lock-up release natively. Safety isolation logic 205 includes a set of pass-gates 206 that are arranged so that each signal line of communication bus 203 can be isolated in response to a control signal provided by MMR 227. In this example, only three signal lines are illustrated to provide communication in each direction between MCU island domain 201 and main domain 202. However, the communication bus 203 may include tens or hundreds of individual signal lines that provide information between voltage domain 201 and voltage domain 202.

Communication interface 225 in MCU island 201 provides a fully synchronous interface for communication transactions between MCU island 201 and main domain 202. In this example, transactions on synchronous communication interface 225 operate according to a defined time period, so a built-in timeout detection logic is not required, as was provided in asynchronous communication interface 125 (see FIG. 1). However, in the case of some sort of error in main domain 202, a transaction may not receive an acknowledgement and the bus, or a portion of the bus, may become locked. Therefore, separate timeout logic 236 is provided that includes timing circuitry that is coupled to various control lines within communication bus 203 that is configured to detect when an expected acknowledgement is not received for a transaction. When a missing acknowledgement is detected, timeout logic 236 sends a timeout error event notification to ESM 124.

In this example SoC 200, a hardware-implemented override finite state machine (FSM) 230 is coupled to ESM 124 to receive error events as they are detected. Override FSM 230 is configured to react immediately to a voltage anomaly in main domain 202 detected by supply monitoring circuit 122 or a timeout event in communication bus 203 detected by timeout logic 236. When an error event is detected, override FSM 230 activates control signals coupled to override logic (ovr-log) 231, 232, 233, 234 to send respective reset or disable signals to cross bar module 107, communication interface 225, timeout logic 236, and isolation logic 205 in order to immediately isolate MCU island 201 from malfunctioning main domain 202.

MMR 227 responds to safety MCU 110 in the event of a detected voltage failure or timeout error to activate isolation control line 228 to cause safety isolation logic 205 to isolate MCU island 201 from main domain 202 by interrupting communication bus 203. When activated, isolation control line 228 causes all of the pass gates 206 to open to prevent erroneous or erratic signals generated by failing logic with main domain 202 from being transmitted to MCU island 201 via communication bus 203. In this manner, safety MCU 110 and DMSC 111 can continue to operate correctly and attempt to restore processing in main domain 102.

In this way, the override FSM 230 provides a redundant hardware-based failure detection and response mechanism. In some such examples, software executed by safety MCU 110 and DMSC 111 are configured to respond to certain error events, while override FSM 230 is configured to immediately respond to certain error events. The type of response can be defined when SoC 200 is designed in some cases. In other cases, the type of response may be flexible and can be selected based on the application that is being performed by SoC 200.

For example, when SoC 300 is designed, the amount of time delay introduced by deglitcher 123 can be defined. Similarly, a length of time for timeout logic 236 to activate can be defined. Additional power supply monitoring circuits for different power supply voltages may be included. Timeout logic 236 may be provided with two or more timeout period detectors. In this case, ESM module 124 may be configured to route an event notification for a short timeout event to safety core 110 for a software response, while a longer timeout event is routed to override FSM 230. In another example, an application may specify a timeout length by programmatically configuring timeout logic 236 if such a capability is provided by timeout logic 236.

Once a software managed error condition has been corrected, safety MCU 110 causes MMR 227 to deactivate isolation control signal 228 and thereby allow communication bus 203 to resume normal communication between MCU domain 201 and main domain 202. Similarly, once an FSM managed error condition has been corrected, override FSM 230 deactivates isolation control signal 234 and thereby allows communication bus 203 to resume normal communication between MCU domain 201 and main domain 202.

Figure 3:
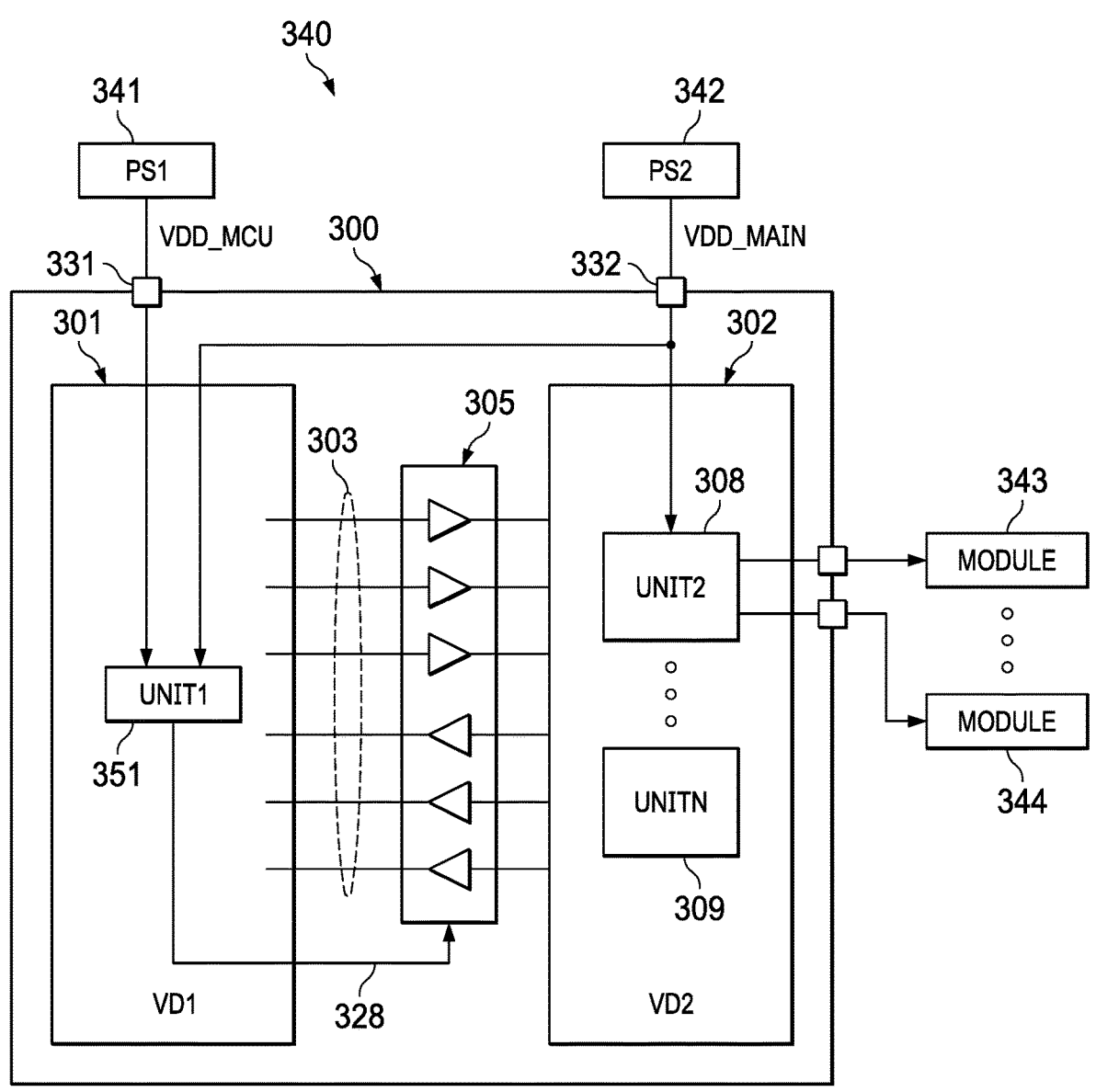
FIG. 3 is a block diagram of an example system that includes an integrated circuit having isolation logic between voltage domains.

In this example, fault detection logic within voltage domain 201 includes the supply monitoring circuits 121, 122, ESM module 124, safety MCU 110, DMSC 111, MMR 127, override FSM 230, override logic 231, 232, 233, and timeout logic 236 that act in an autonomous manner by means of a combination of hardware and software responses to failure of a power supply or a timing error. In this manner, operation of SoC 100 can often be restored quickly after a fault condition is resolved. In other examples, fault detection logic within voltage domain 101 may include additional, or different, types of hardware and software capabilities that are used to resolve a failure of a power supply or a timing error System Example FIG. 3 is a block diagram of an example system 340 that includes an integrated circuit SoC 300 having isolation logic 305 between voltage domains 301, 302. Power supply 341 provides VDD_MCU voltage to voltage domain 301 via voltage terminal 331. Power supply 342 provides VDD_MAIN voltage to voltage domain 302 via voltage terminal 332. External modules 343, 344 represent one or more peripheral modules that are included in system 340 and provide various processing and/or interface functions for the system, such as automotive applications, industrial applications, etc.

SoC 300 is an example SoC that is similar to SoC 100 of FIG. 1 or SoC 2 of FIG. 2. Voltage domain 301 (VD1) includes processing unit 1 351 that includes a safety MCU, DMSC, ESM, PSC, override FSM, etc. as described in more detail in FIG. 2. Voltage domain 301 receives operating voltage from power supply PS1 341.

Voltage domain VD2 302 includes one or more processing units 308, 309 that receive operating voltage from power supply PS2 342. Processing units 308, 309 communicate with processing unit 351 via communication bus(s) 303 as described in more detail for communication bus 103 (FIG. 1) or communication bus 203 (FIG. 2). Isolation logic 305 is controlled by processing unit 351 to provide isolation between voltage domain 301 and voltage domain 302 when a voltage anomaly is detected on VDD_MAIN or a timing error is detected on communication bus 303, as described in more detail with regards to FIG. 1 and FIG. 2.

In this example, software executed by safety MCU and DMSC in processing unit 351 are configured to respond to certain error events, while an override FSM in voltage domain 301 is configured to immediately respond to certain error events. The type of response can be defined when SoC 300 is designed in some cases. In other cases, the type of response may be flexible and can be selected based on the application that is being performed by SoC 300.

For example (referring to FIG. 2), when SoC 300 is designed, the amount of time delay introduced by deglitcher 123 can be defined. Similarly, a length of time for timeout logic 236 to activate can be defined. Additional power supply monitoring circuits for different power supply voltages may be included. Timeout logic 236 may be provided with two or more timeout period detectors. In this case, ESM module 124 may be configured to route an event notification for a short timeout event to safety core 110 for a software response, while a longer timeout event is routed to override FSM 230. In another example, an application may specify a timeout length by programmatically configuring timeout logic 236 if such a capability is provided by timeout logic 236.

Once a software managed error condition has been corrected, safety the MCU causes MMR in voltage domain 301 to deactivate isolation control signal 328 and thereby allow communication bus 303 to resume normal communication between MCU domain 301 and main domain 302. Similarly, once an FSM managed error condition has been corrected, the override FSM deactivates isolation control signal 328 and thereby allows communication bus 303 to resume normal communication between MCU domain 301 and main domain 302.

FIG. 4 is a flow diagram of operation of an example SoC device that has multiple voltage domains. In a described example, the SoC has two voltage domains, such as illustrated in FIGS. 1 and 2 for SoC 100, 200. In this case, there is a main voltage domain and a safety island voltage domain. In other examples, there may be more than two voltage domains monitored and controlled by a single safety island voltage domain. In this example, the safety island voltage domain includes a microcontroller, such as safety MCU 110 in FIG. 1, configured to execute safety software to respond to detected fault conditions At 400, in some examples the type of response is defined when an SoC is designed. In other cases, the type of response may be flexible and can be selected based on the application that is being performed by the SoC. For example, when an SoC is designed, the amount of time delay introduced by a deglitcher on a voltage monitoring circuit can be defined. Similarly, a length of time for timeout logic on a communication bus to activate can be defined. Additional power supply monitoring circuits for different power supply voltages may be included. Timeout logic on the communication bus may be provided with two or more timeout period detectors. In this case, an error signaling module may be configured to route an event notification for a short timeout event to safety core for a software response, while a longer timeout event is routed to an override FSM for immediate hardware response. In another example, an application may specify a timeout length by programmatically configuring the communication bus timeout logic if such a capability is provided by timeout logic.

At 402, each voltage domain is supplied by a separate voltage supply (VDD). The VDD_MCU supply coupled to the safety island voltage domain is a robust supply that may include backup capabilities (such as battery backup) in order to maintain operation of the MCU safety island voltage domain under adverse conditions. VDD_MAIN is the operating voltage provided to main voltage domain and is used by the various processing logic, memories, etc. located within main voltage domain.

At 404, communication between logic modules located in separate voltage domains is accommodated by a communication bus, such as communication bus 103 (see FIG. 1). Safety isolation logic, such as logic 105 (see FIG. 1) is provided to allow the communication bus to be electrically isolated in response to detection of an error.

At 406, fault detection logic, which may include hardware-based fault detection logic and software-based fault detection logic (e.g., a safety MCU running a set of safety software), in the safety island voltage domain monitors various conditions that affect operation of the main voltage domain. In this example, a voltage supply monitoring circuit monitors VDD_MAIN for low voltage or high voltage conditions. Detected voltage anomalies in VDD_MAIN generate events that are sent to a de-glitcher circuit to filter out short transient voltage anomalies, and then on to an error signaling module.

The communication bus interface in the safety island voltage domain includes timeout logic that monitors transactions that are occurring on communication bus. If a given transaction take too long and times out, then a timeout error signal is activated and sent to the error signaling module.

Other types of error detection logic may be included in the safety island voltage domain to detect various types of anomalous behavior, such as temperature, pressure, etc.

At 408, the safety MCU receives the error signals from the detection logic. Safety software running in the safety MCU allows a programmable response in the event of a failure being detected. Software code and actions are provided to ensure robustness of a response to a detected failure. For example, a failure in a voltage level reported by the voltage monitor will trigger an interrupt, which in turn will cause the safety MCU to execute a service routine that will go and check the various voltage monitors to identify the voltage domain(s) experiencing the failure(s). From there that same software can check further status of the timeout circuits and activate then to start operating in auto-acknowledge mode in response to any MCU master request and ignoring/blocking the potentially corrupted arriving data from the MAIN domain, which is the one assumed failing in this case.

In various examples, the software code running in the safety MCU could be either vendor provided safety software code, which is developed by the makers of the SOC, or user provided safety software code, which is implemented by a reseller or user of the SOC. Vendor provided safety software code is transparent to the customer.

The safety software includes program instructions that are executed by safety MCU. In some examples, the safety software is stored in read only memory that is accessible the safety MCU. In some examples, there may be a portion of safety software that can be installed or updated during operation of SOC.

At 410, certain detected faults may need to be handled via dedicated hardware to provide a quick and failsafe response. In this case, hardware logic, such as override FSM 230 (see FIG. 2) is operable to override control signal outputs provided by safety MCU in order to immediately isolate the main voltage domain from the safety island voltage domain.

At 412, a faulty domain is isolated from the safety island voltage domain in response to detection of fault condition. In some examples, this includes placing the communication bus in an isolation mode that prevents erroneous data from being transferred over the communication bus. In this manner, processing logic located in the safety island voltage domain can continue operation in order to assist in restoring operation of SOC.

At 414, the safety MCU may attempt to reboot, or otherwise restart, processing logic in the main voltage domain once it has determined that the fault condition(s) has been corrected.

In this manner, operation of an SoC can often be restored quickly after a fault condition is resolved. In other examples, fault detection logic within the safety voltage domain may include additional, or different, types of hardware and software capabilities that are used to resolve a failure of a power supply or a timing error

OTHER EMBODIMENTS

In described examples, two voltage domains are illustrated for clarity. In other examples, there may be several additional voltage domains that may be isolated from a safety island voltage domain in response to detection of a voltage or timing error.

In described examples, a single main domain voltage supply is illustrated. In another example, there may be several different voltage domain power supplies that are all monitored by voltage monitors located on a common safety island voltage domain.

In described examples, main domain voltage levels and communication bus timing is monitored by the fault detection logic. In other examples, additional or different conditions may be monitored by the safety software and/or override safety FSM to provide protection against other types of fault conditions. For example, temperature, pressure, vibration, etc. may be important to monitor in various operating environments.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An integrated circuit device comprising:
   a first voltage domain;
   a second voltage domain; and
   a communication circuit coupled between the first voltage domain and the second voltage domain, wherein the first voltage domain includes:
      an error signal circuit;
      a processor core coupled to the error signal circuit and configured to cause the communication circuit to inhibit communication between the first voltage domain and the second voltage domain; and
      a fault response circuit coupled between the error signal circuit and the communication circuit and configured to cause the communication circuit to inhibit communication between the first voltage domain and the second voltage domain.

2. The integrated circuit device of claim 1, wherein:

the first voltage domain includes a memory mapped register coupled to the processor core and to the communication circuit; and the processor core is configured to cause the communication circuit to inhibit communication between the first voltage domain and the second voltage domain by writing a value to the memory mapped register.

3. The integrated circuit device of claim 1, wherein the error signal circuit is configured to:

detect a voltage of the second voltage domain exceeding a threshold; and based on the voltage of the second voltage domain exceeding the threshold, provide an error signal to the processor core and the fault response circuit.

4. The integrated circuit device of claim 3, wherein the processor core is configured to execute software to determine whether to cause the communication circuit to inhibit communication between the first voltage domain and the second voltage domain based on the error signal.

5. The integrated circuit device of claim 3, wherein the fault response circuit is configured to cause the communication circuit to inhibit communication between the first voltage domain and the second voltage domain based on the error signal.

6. The integrated circuit device of claim 1 further comprising a voltage supply monitor circuit that includes an input coupled to the second voltage domain and an output coupled to the error signal circuit.

7. The integrated circuit device of claim 6 further comprising a deglitch circuit coupled between the output of the voltage supply monitor circuit and the error signal circuit.

8. The integrated circuit device of claim 1, wherein:

the first voltage domain includes:

a communication interface coupled to the communication circuit; and a timeout detection circuit coupled between eh communication interface and the error signal circuit; and the error signal circuit is configured to:

detect a timeout associated with the communication interface; and based on the timeout associated with the communication interface, provide an error signal to the processor core and the fault response circuit.

9. The integrated circuit device of claim 8, wherein the processor core is configured to execute software to determine whether to cause the communication circuit to inhibit communication between the first voltage domain and the second voltage domain based on the error signal.

10. The integrated circuit device of claim 8, wherein the fault response circuit is configured to cause the communication circuit to inhibit communication between the first voltage domain and the second voltage domain based on the error signal.

11. An integrated circuit device comprising:

a first voltage domain;

a second voltage domain; and a communication circuit coupled between the first voltage domain and the second voltage domain that includes a set of pass gates, wherein the first voltage domain includes:

an error signal circuit; and a processor core coupled to the error signal circuit and configured to execute software to determine whether to cause the communication circuit to inhibit communication between the first voltage domain and the second voltage domain based on the error signal circuit.

12. The integrated circuit device of claim 11, wherein:

the first voltage domain includes a memory mapped register coupled to the processor core and to the communication circuit; and the processor core is configured to cause the communication circuit to inhibit communication between the first voltage domain and the second voltage domain by writing a value to the memory mapped register.

13. The integrated circuit device of claim 11, wherein the error signal circuit is configured to:

detect a voltage of the second voltage domain exceeding a threshold; and based on the voltage of the second voltage domain exceeding the threshold, provide an error signal to the processor core.

14. The integrated circuit device of claim 11 further comprising a voltage supply monitor circuit that includes an input coupled to the second voltage domain and an output coupled to the error signal circuit.

15. The integrated circuit device of claim 11, wherein:

the first voltage domain includes:

a communication interface coupled to the communication circuit; and a timeout detection circuit coupled between eh communication interface and the error signal circuit; and the error signal circuit is configured to:

detect a timeout associated with the communication interface; and based on the timeout associated with the communication interface, provide an error signal to the processor core.

16. The integrated circuit device of claim 11, further comprising a fault response circuit coupled between the error signal circuit and the communication circuit and configured to determine whether to cause the communication circuit to inhibit communication between the first voltage domain and the second voltage domain based on the error signal circuit.

17. A method comprising:

determining, by a circuit in a first voltage domain, whether a fault occurred in a voltage supplied to a second voltage domain;

determining, by a processor core, whether to cause a communication circuit to inhibit communication between the first voltage domain and the second voltage domain based on whether the fault occurred; and in parallel, determining, by a fault response circuit, whether to cause the communication circuit to inhibit communication between the first voltage domain and the second voltage domain based on whether the fault occurred.

18. The method of claim 17, wherein the fault includes at least one of a high voltage or low voltage condition associated with the voltage.

19. The method of claim 17 further comprising:

determining whether a communication error occurred between the first voltage domain and the second voltage domain;

determining, by the processor core, whether to cause the communication circuit to inhibit communication between the first voltage domain and the second voltage domain based on whether the communication error occurred; and in parallel, determining, by the fault response circuit, whether to cause the communication circuit to inhibit communication between the first voltage domain and the second voltage domain based on whether the communication error occurred.

20. The method of claim 19, wherein the communication error includes a communication timeout error.

* * * * *